(12) United States Patent
Tanaka et al.

(10) Patent No.: US 12,424,525 B2
(45) Date of Patent: Sep. 23, 2025

(54) SEMICONDUCTOR DEVICES AND METHODS OF MANUFACTURING SEMICONDUCTOR DEVICES

(71) Applicant: Amkor Technology Singapore Holding Pte. Ltd., Valley Point (SG)

(72) Inventors: Shigeki Tanaka, Hokkaido (JP); Hideharu Kamata, Fukushima-ken (JP); Katsunori Wako, Miyagi-ken (JP)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 438 days.

(21) Appl. No.: 17/892,058

(22) Filed: Aug. 20, 2022

(65) Prior Publication Data
US 2024/0063096 A1    Feb. 22, 2024

(51) Int. Cl.
*H01L 23/495* (2006.01)
*H01L 21/48* (2006.01)
*H01L 23/00* (2006.01)

(52) U.S. Cl.
CPC .... *H01L 23/49548* (2013.01); *H01L 21/4842* (2013.01); *H01L 23/49513* (2013.01); *H01L 23/49534* (2013.01); *H01L 23/49582* (2013.01); *H01L 24/32* (2013.01); *H01L 24/48* (2013.01); *H01L 24/73* (2013.01); *H01L 24/83* (2013.01); *H01L 21/4828* (2013.01); *H01L 2224/26175* (2013.01); *H01L 2224/32245* (2013.01); *H01L 2224/48245* (2013.01);
(Continued)

(58) Field of Classification Search
CPC ......... H01L 23/49548; H01L 23/49513; H01L 23/49534; H01L 23/49582; H01L 23/3107; H01L 23/3142; H01L 23/49503; H01L 24/32; H01L 24/48; H01L 24/73; H01L 24/83; H01L 24/49; H01L 21/4842; H01L 21/4825; H01L 21/565; H01L 2924/181; H01L 23/49541
See application file for complete search history.

(56) References Cited

U.S. PATENT DOCUMENTS 7,049,683 B1 * 5/2006 Sirinorakul ............. H01L 24/48
257/667
10,211,131 B1 * 2/2019 Kitnarong ........... H01L 23/3142
(Continued)

FOREIGN PATENT DOCUMENTS

JP       2017210639 A  * 11/2017

*Primary Examiner* — Alonzo Chambliss
(74) *Attorney, Agent, or Firm* — Kevin B. Jackson

(57) ABSTRACT

In one example, a semiconductor device includes a conductive structure having a conductive structure upper side. A roughening is on the conductive structure upper side and a groove is in the conductive structure extending partially into the conductive structure from the conductive structure upper side. An electronic component is attached to the conductive structure upper side with an attachment film. An encapsulant covers the electronic component, at least portions of the roughening, and at least portions of the conductive structure upper side. The groove has smoothed sidewalls that include substantially planarized portions of the roughening. The smooth sidewalls reduce flow of the attachment film across the conductive structure upper side to improve adhesion of the encapsulant to the conductive structure. Other examples and related methods are also disclosed herein.

19 Claims, 11 Drawing Sheets

(52) U.S. Cl.
CPC ............... *H01L 2224/73265* (2013.01); *H01L 2224/83097* (2013.01); *H01L 2224/83203* (2013.01); *H01L 2924/182* (2013.01); *H01L 2924/18301* (2013.01); *H01L 2924/35121* (2013.01)

(56) References Cited

U.S. PATENT DOCUMENTS

| | | | | |
|---|---|---|---|---|
| 11,302,652 | B2* | 4/2022 | Wang | H01L 23/3114 |
| 11,367,666 | B2* | 6/2022 | Choi | H01L 23/3142 |
| 12,119,289 | B2* | 10/2024 | Tea | H01L 21/4825 |
| 2002/0084518 | A1* | 7/2002 | Hasebe | H01L 23/3107 |
| | | | | 257/784 |
| 2009/0039486 | A1* | 2/2009 | Shimazaki | H01L 21/568 |
| | | | | 29/829 |
| 2009/0072367 | A1* | 3/2009 | Poddar | H01L 24/83 |
| | | | | 257/676 |
| 2014/0001620 | A1* | 1/2014 | Shimizu | H01L 23/4952 |
| | | | | 257/676 |

* cited by examiner

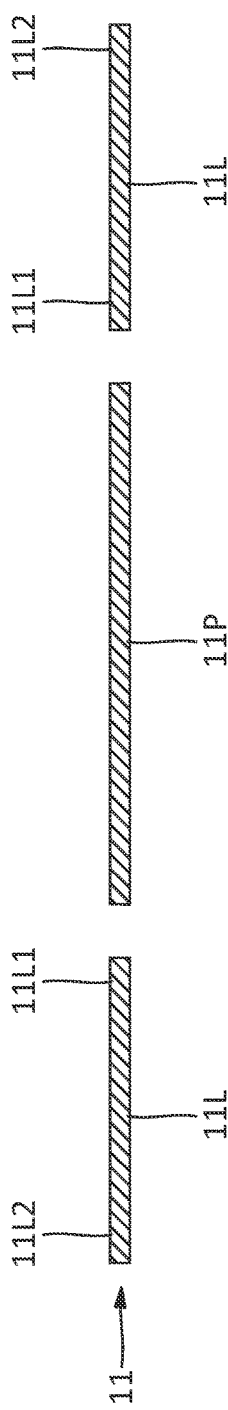
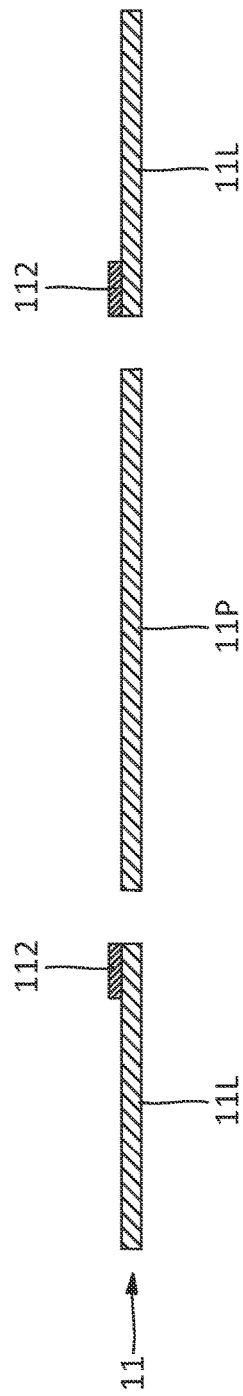
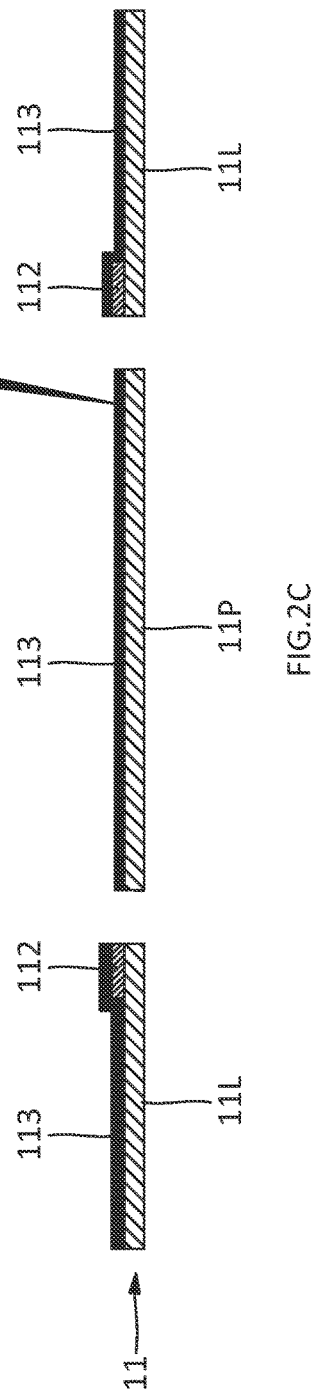
FIG.2A
FIG.2B
FIG.2C

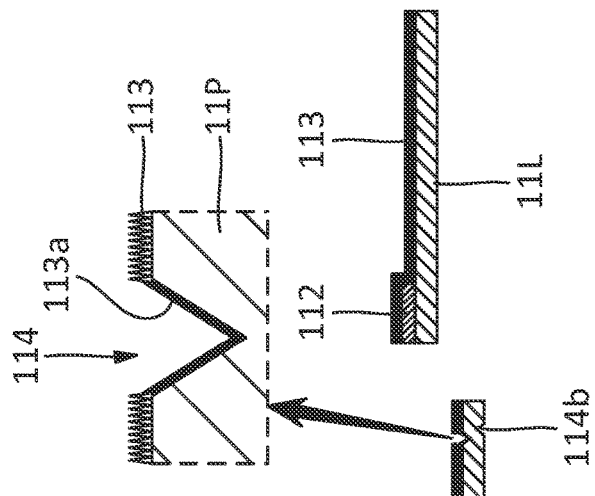
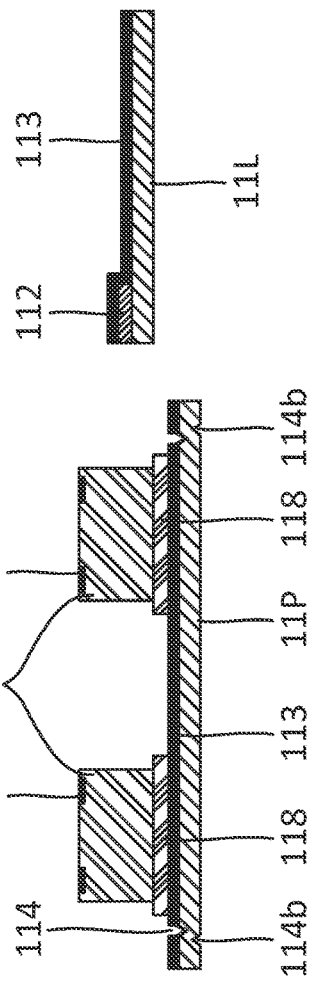
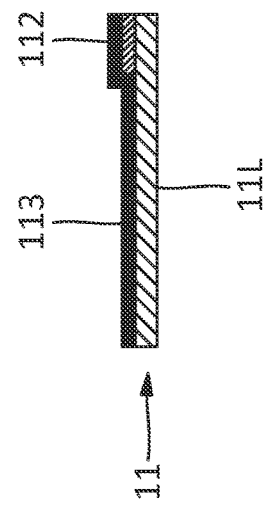
FIG.2D
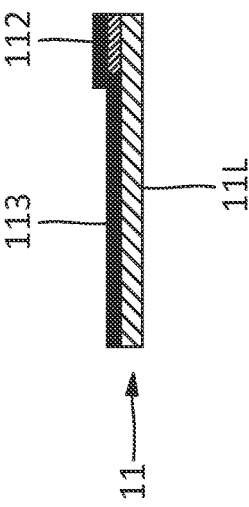
FIG.2E

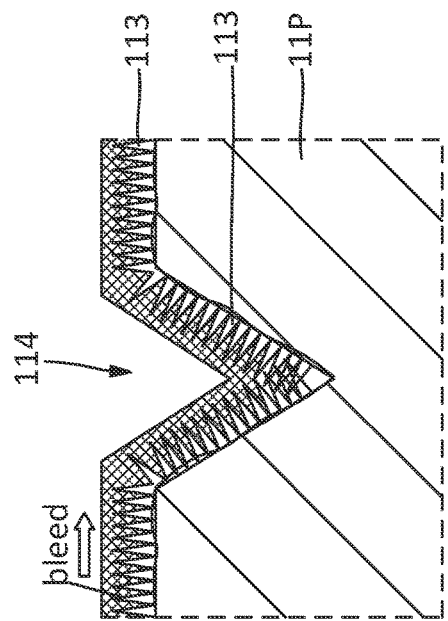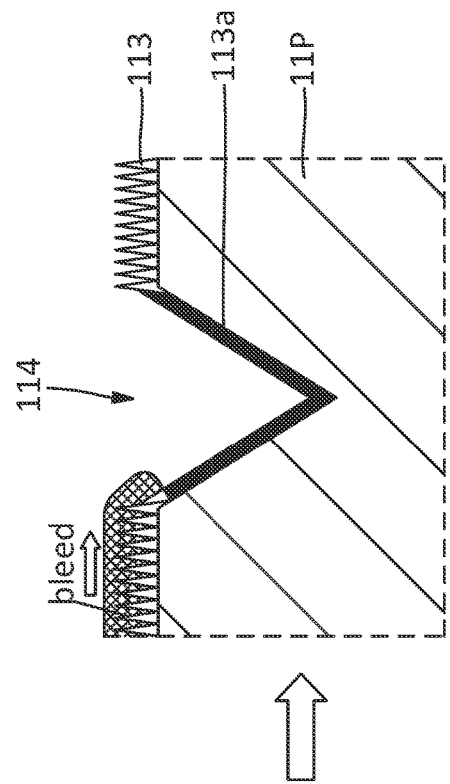
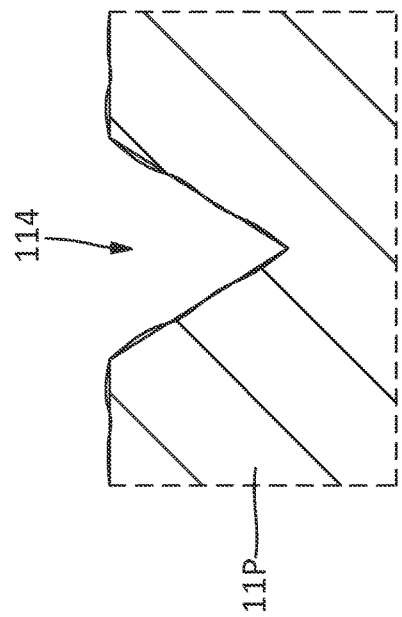
FIG.3A
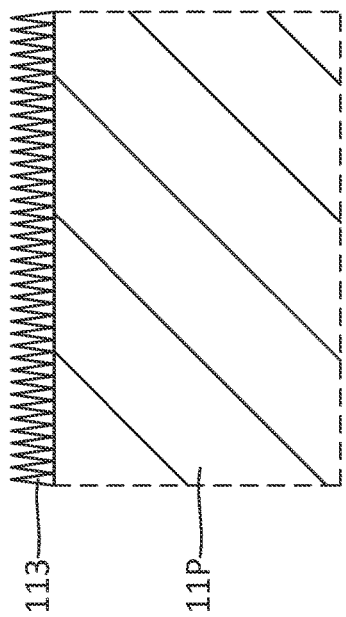
FIG.3B

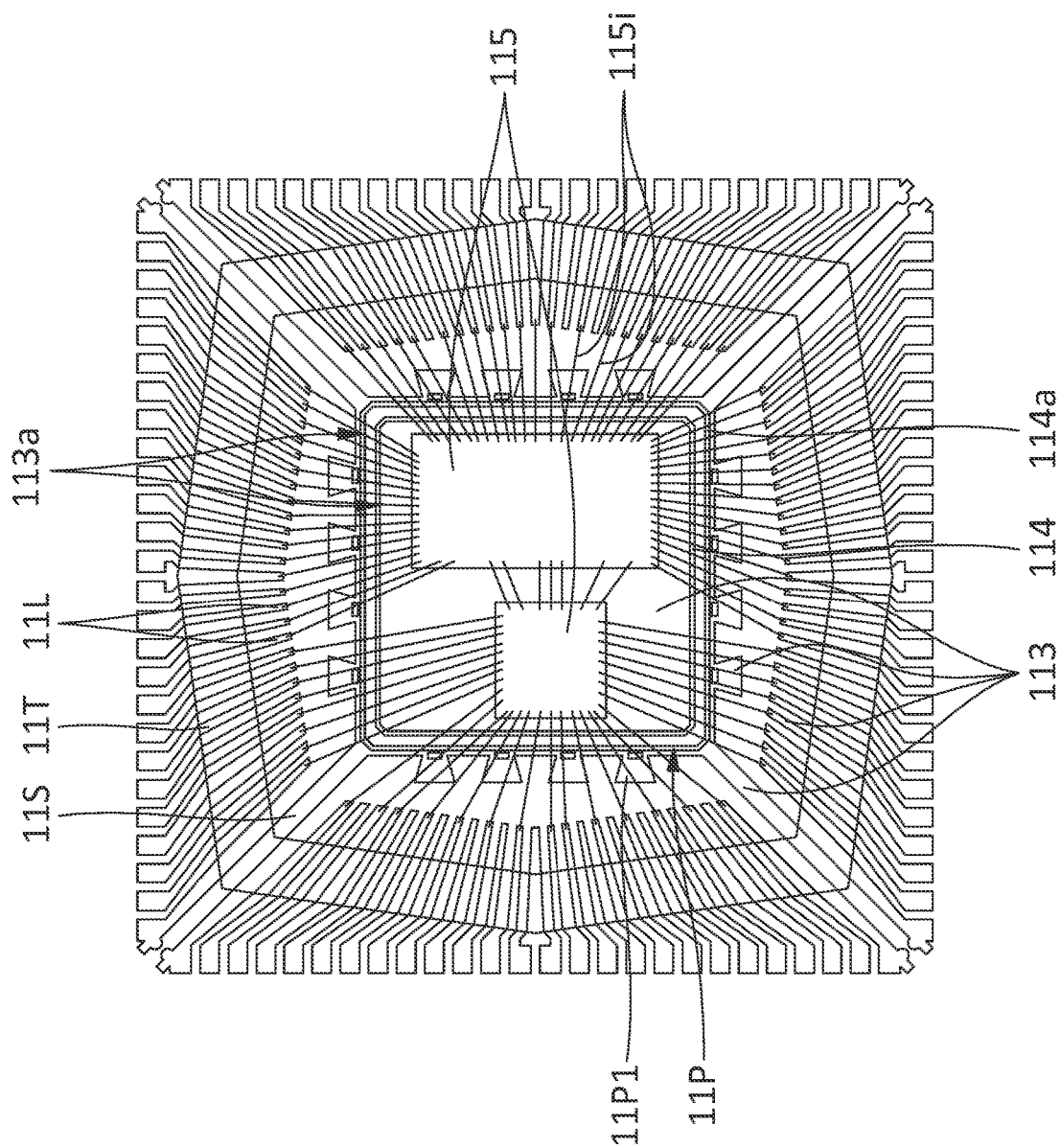

SEMICONDUCTOR DEVICES AND METHODS OF MANUFACTURING SEMICONDUCTOR DEVICES

CROSS REFERENCE TO RELATED APPLICATIONS

Not Applicable.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A, 2B, 2C, 2D, 2E, 2F, 2G, 2H, and 2I show cross-sectional views of an example method for manufacturing an example electronic device.

FIGS. 3A and 3B show cross-sectional views of an example groove for an example electronic device.

FIG. 5 shows an X-ray top plan view of an example electronic device.

Figure 1:
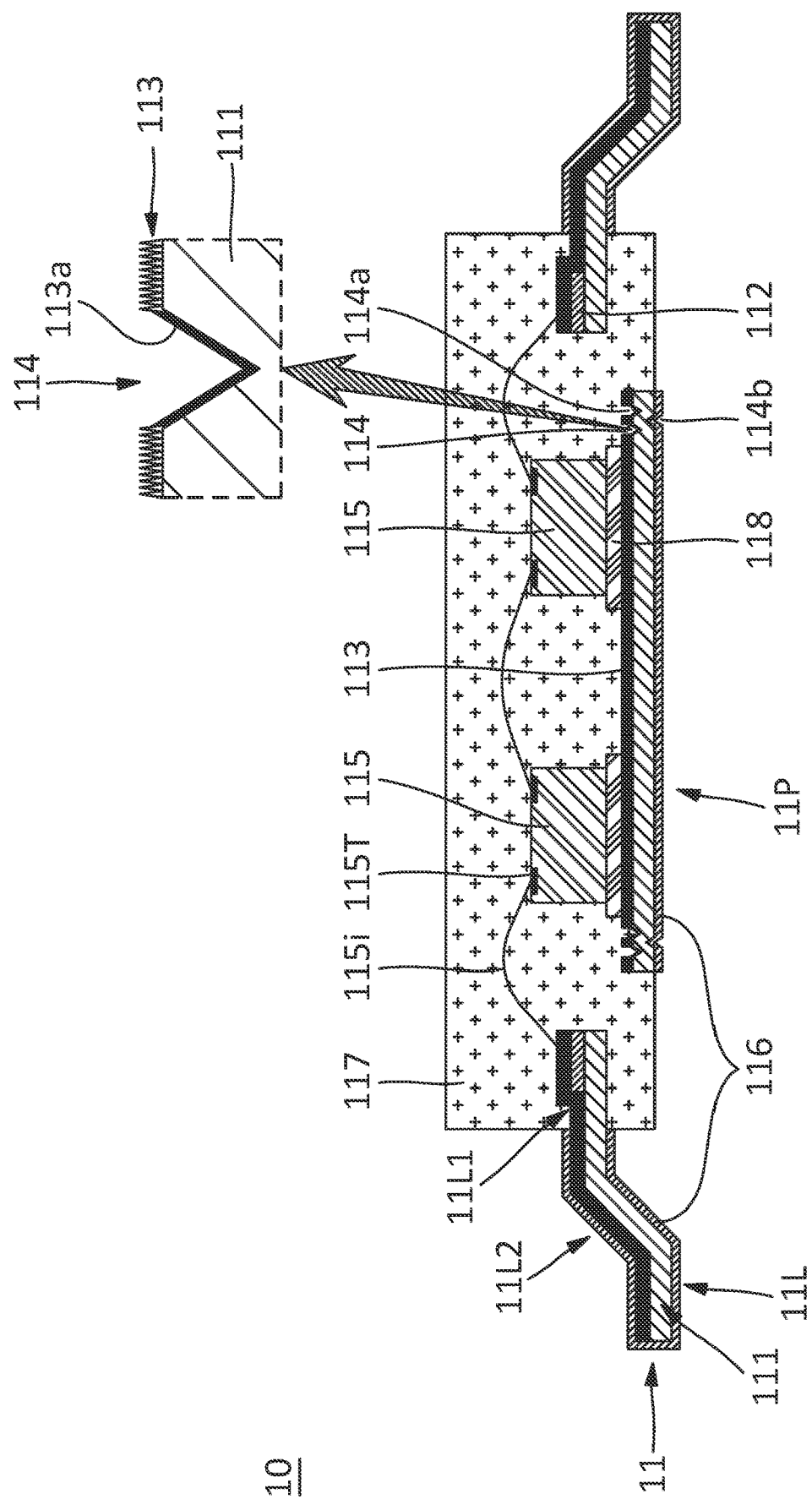
FIG. 1 shows a cross-sectional view of an example electronic device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or." As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, the first element discussed in the present disclosure could be termed to be the second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In an example, a semiconductor device includes a conductive structure having a conductive structure upper side. A roughening is on the conductive structure upper side and a groove is in the conductive structure extending partially into the conductive structure from the conductive structure upper side. An electronic component is attached to the conductive structure upper side with an attachment film, the electronic component proximate to the groove, laterally separated from the groove, and having a component terminal coupled to the conductive structure. An encapsulant covers the electronic component, at least portions of the roughening, and at least portions of the conductive structure upper side; wherein the groove has smoothed sidewalls comprising substantially planarized portions of the roughening, and the encapsulant is within the groove.

In an example, a semiconductor device includes a substrate having a paddle having an upper paddle side, a lower paddle side opposite to the upper paddle side, and a lateral paddle side between the upper paddle side and the lower paddle side; and a lead having an upper lead side, a lower lead side opposite to the upper lead side, and a lateral lead side between the upper lead side and the lower lead side. A roughened structure is on the upper paddle side. A first groove extends partially into the paddle. An electronic component is coupled to the paddle with an attachment film. A package body covers the electronic component and at least portions of the paddle and the lead. In the present example, the first groove has smoothed sidewall and is substantially devoid of the attachment film. The roughened structure is configured to enhance adhesion between the package body and the substrate.

In an example, a method of manufacturing a semiconductor device includes providing a conductive structure having an upper conductive structure side, a lower conductive structure side opposite to the upper conductive structure side; a roughening on the upper conductive structure side; and a groove in the upper conductive structure side extending partially into the conductive structure, wherein the groove has smoothed sidewalls. The method includes coupling an electronic component to the conductive structure with an attachment film, the electronic component proximate to and laterally separated from the groove. The method includes providing an encapsulant covering the electronic component, at least portions of the roughening, the smoothed sidewalls, and at least portions of the conductive structure, wherein the groove is substantially devoid of the attachment film, and the roughening enhances adhesion between the encapsulant and the conductive structure. In another example, providing the conductive structure includes providing a paddle having an upper paddle side, a lower paddle side opposite to the upper paddle side, and a lateral paddle side between the upper paddle side and the lower paddle side; providing the roughening on the upper paddle side; and after providing the roughening, providing the groove in the upper paddle side.

Other examples are included in the present disclosure. Such examples may be found in the figures, in the claims, or in the description of the present disclosure.

FIG. 1 shows a cross-sectional view of an example electronic device 10. In the example shown in FIG. 1, electronic device 10 can comprise substrate 11, electronic component 115, component interconnect 115i, external plating 116, encapsulant 117, and attachment film 118.

Substrate 11 can comprise lead 11L, paddle 11P, conductive structure 111, internal plating 112, roughening 113, smoothed roughening 113a, grooves 114, 114a and 114b. Electronic component 115 can comprise component terminal 115T. Lead 11L can comprise inner lead 11L1 and outer lead 11L2.

Substrate 11 and encapsulant 117 can be referred to as an electronic package, such as a semiconductor package, and the package can provide protection for electronic component 115 from external elements or environmental exposure. The electronic package can provide coupling to external electrical components through lead 11L.

FIGS. 2A, 2B, 2C, 2D, 2E, 2F, 2G, 2H, and 2I show cross-sectional views of an example method for manufacturing electronic device 10.

FIG. 2A shows a cross-sectional view of electronic device 10 at an early stage of manufacture. In the example shown in FIG. 2A, substrate 11 can be provided. In some examples, substrate 11 can comprise or be referred to as a lead frame or leadframe. Substrate 11 can comprise conductive structure 111 having leads 11L or paddle 11P.

In some examples, paddle 11P can comprise or be referred to as a die paddle, die pad, or flag. Paddle 11P can comprise an upper paddle side, a lower paddle side opposite to the upper paddle side, and a lateral paddle side between the upper paddle side and the lower paddle side.

In some examples, lead 11L can comprise or be referred to as a lead finger or a lead tip. Lead 11L can comprise inner lead 11L1 or outer lead 11L2. Lead 11L can comprise an upper lead side, a lower lead side opposite to the upper lead side, and a lateral lead side between the upper lead side and the lower lead side. In some examples, a plurality of leads 11L can be arranged adjacent a perimeter of paddle 11P.

In some examples, conductive structure 111 can comprise a material, such as Cu, Cu—Fe—P, Cu—Ni—Si, or NiFe. In some examples, substrate 11 can be provided by stamping (pressing) or etching and can be provided in the form of a matrix having one or more rows or columns or in the form of a strip. In some examples, the thickness of substrate 11 can range from approximately 100 μm (micrometers) to approximately 200 μm. Substrate 11 can couple electronic components 115 to each other or to external electronic components or can protect the electronic components 115 from external stress.

FIG. 2B shows a cross-sectional view of electronic device 10 at a later stage of manufacture. In the example shown in FIG. 2B, internal plating 112 can be provided. In some examples, internal plating 112 can be provided at a portion (e.g., inner lead 11L1) of lead 11L where component interconnect 115i is bonded in a later stage. In some examples, internal plating 112 can comprise Ag, Au, Pt, Pd, or respective combinations. In some examples, a portion of substrate 11 can be covered by a mask and a silver-plating solution sprayed onto an exposed portion to provide partial silver plating 112. In some examples, a resist can be deposited over substrate 11, and the deposited resist can be treated to expose a portion, and substrate 11 can be immersed in a plating bath to provide partial silver plating 112. In some examples, the thickness of internal plating 112 can range from approximately 1 μm to approximately 10 μm. Internal plating 112 can help the component interconnect 115i reliably couple to lead 11L.

FIG. 2C shows a cross-sectional view of electronic device 10 at a later stage of manufacture. In the example shown in FIG. 2C, roughening 113 can be provided. In some examples, roughening 113 can be provided on paddle 11P. In some examples, roughening 113 can be provided on the upper side or lateral side of paddle 11P. In some examples, roughening 113 can be provided on upper side or lateral side portions of lead 11L1. In some examples, roughening 113 can also be provided on internal plating 112. In some examples, roughening 113 can cover inner lead 11L1 portion of lead 11L, without covering outer lead 11L2 portion of lead 11L. Roughening 113 can comprise grains, such as acicular crystals or other irregular formations, that can improve later adhesion with encapsulant 117. Roughening 113 can also be referred to as a roughened structure.

In some examples, roughening 113 can be provided by a method using an aqueous solution comprising a main agent comprising an inorganic acid and an oxidizer for copper, and an auxiliary agent comprising one or more azoles and one or more etching inhibitors. In some examples, the inorganic acid can comprise hydrochloric acid, sulfuric acid, nitric acid, phosphoric acid, chloric acid, sulfamic acid, boric acid, or boric-hydrofluoric acid. In some examples, the oxidizer for copper can comprise hydrogen peroxide, ferric chloride, cupric chloride or a peroxo compound. In some examples, the azoles can comprise diazole, triazole or tetrazole. In some examples, the etching inhibitors can comprise phosphorous acid, hypophosphorous acid or pyrophosphoric acid. In some examples, the aqueous solution can crystallize the surface of copper or copper alloy and improve adhesion with an adhesive or encapsulant.

In some examples, roughening 113 can be provided by a method of forming continuous irregularities by micro-etching and then performing chromate treatment and coupling agent treatment. In some examples, the micro-etching can be performed by a treatment solution where a chelating agent is added with an organic acid. In some examples, the chromate treatment can be performed with an aqueous solution of sodium dichromate. In some examples, the chelating agent treatment can be performed with an aqueous solution of an organosilane coupling agent, such as mercapto silane. In some examples, micro-etching and the chromate treatment can improve the adhesion between copper and the encapsulant. In some examples, the coupling agent treatment can mediate adhesion between copper and the encapsulant.

In some examples, roughening 113 can be provided by a method of immersion using an alkaline aqueous solution containing an oxidizer such as sodium chlorite. In some examples, the reduction treatment can be additionally performed by an acidic solution where one or more kinds of amine boranes and a boron-based chemical are mixed.

In some examples, roughening 113 can provide fine needle-like crystals or acicular crystals of copper oxide (e.g., CuOx, Cu3) on paddle 11P or lead 11L. In some examples, the thickness of roughening 113 can range from approximately 0.05 μm to approximately 0.2 μm. In some examples, roughening 113 with the properties of needle-like crystals or acicular crystals can provide an anchor effect to improve the adhesion strength between the encapsulant 117 and the substrate 11. In some examples, roughening 113 can improve the adhesion strength between the attachment film 118 and the substrate 11.

In some examples, one or more sides of substrate 11 can be coated with a water-repellent material such as anti-EBO (Epoxy Bleed Out) or anti-ROB (Resin Bleed Out). In some examples, roughening 113 can comprise or can be coated with the anti-EBO. In some examples, the anti-EBO can comprise Sulfated-Polyoxyalkylated-Bisphenol-A. In some examples, the anti-EBO can be of monomolecular adsorption (e.g., thickness can be less than approximately 1 nm). The anti-EBO can reduce bleed out on paddle 11P if attachment film 118 flows out along the interface between the lower side of electronic component 115 and the upper side of paddle 11P.

FIG. 2D shows a cross-sectional view of electronic device 10 at a later stage of manufacture. In the example shown in FIG. 2D, groove 114 can be provided. In some examples, groove 114 can be provided on the upper side of paddle 11P. In some examples, groove 114 can be provided spaced apart from the perimeter of paddle 11P. In some examples, one or more additional groove 114a can be provided (refer to FIG. 1). In some examples, groove 114 can be provided in at least one row or more. In some examples, the cross-sectional shape of groove 114 can be approximately V-shaped or U-shaped. In some examples, groove 114 can be provided in a pressing or stamping manner by a press mold. In some examples, the depth of groove 114 can range from approximately 5 µm to approximately 60 µm. In some examples, after providing groove 114, the grains of roughening 113 can be crushed and substantially smoothed or planarized to define smoothed roughening 113a or smoothed sidewalls 113a for groove 114. That is, groove 114 has a surface finish that is smoother than roughening 113. In some examples, roughening 113 has a first outer surface texture and smoothed roughening 113a has a second outer surface texture that is smoother than the first outer surface texture. In some examples, the epoxy or resin of the attachment film 118 can be restricted from bleed out by smoothed roughening 113a or the smoothed sidewalls of groove 114.

In some examples, groove 114b can be provided on the lower side of the paddle 11P. Groove 114b can be provided as a measure against the burr of the encapsulant 117 on the lower side of paddle 11P. In some examples, groove 114b can be provided spaced apart from the perimeter of paddle 11P. In some examples, upper groove 114 and lower groove 114b can be horizontally spaced apart from each other. In some examples, the positions of upper groove 114 and lower groove 114b can overlap each other. In some examples, lower groove 114b can be provided similar as described for upper groove 14 and can have a similar depth.

FIG. 2E shows a cross-sectional view of electronic device 10 at a later stage of manufacture. In the example shown in FIG. 2E, electronic component 115 can be provided. Electronic component 115 can be coupled to paddle 11P through attachment film 118, such as silver epoxy paste, silver filled epoxy, or an adhesive. In some examples, electronic component 115 can be pressed and attached to attachment film 118 after attachment film 118 is first attached to paddle 11P. In some examples, after attachment film 118 is first attached to electronic component 115, electronic component 115 can be pressed to be attached to paddle 11P. In some examples, heat can be provided during the attachment. During this attachment process, a low molecular weight compound (e.g., also referred to as a bleed) from attachment film 118 can tend to flow onto paddle 11P. However, excessive bleed can be prevented by smoothed roughening 113a or the smoothed sidewalls of groove 114.

In some examples, electronic component 115 can comprise or be referred to as a die, a chip, a package, a functional/active component, a power component, a passive component, a controller, a processor, a logic, or a memory component. The thickness of electronic component 115 can range from approximately 50 µm to approximately 800 µm. In some examples, electronic component 115 can have various configurations and can perform various operations for operating electronic device 10.

Figure 2F:
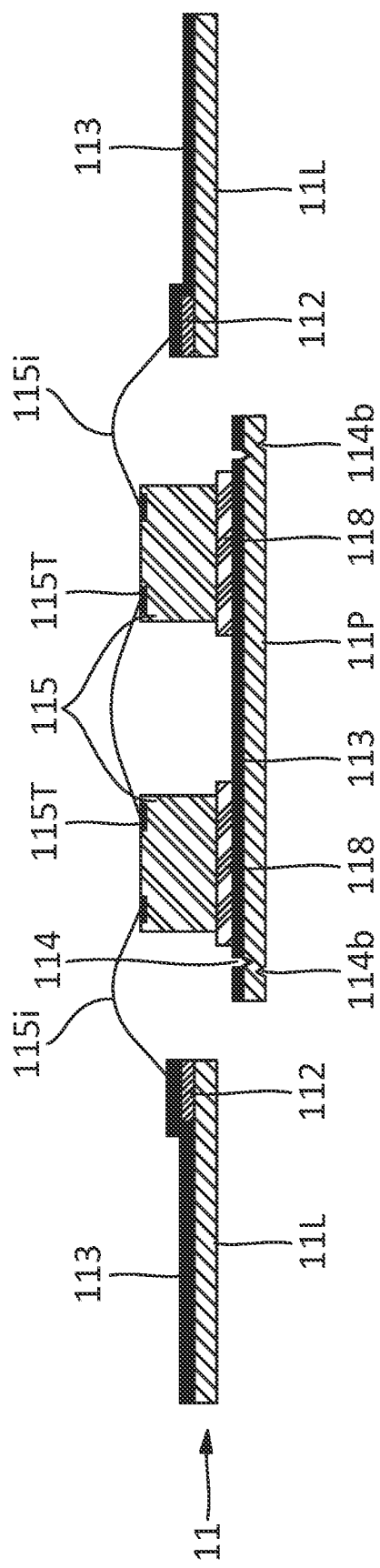

FIG. 2F shows a cross-sectional view of electronic device 10 at a later stage of manufacture. In the example shown in FIG. 2F, component interconnect 115i can be provided. In some examples, component interconnect 115i can comprise or be referred as Au wire, Al wire or Cu wire. In some examples, the diameter of component interconnect 115i can range from approximately 10 µm to approximately 100 µm. In some examples, component interconnect 115i can couple component terminal 115T of one electronic component 115 to component terminal 115T of other electronic component 115. In some examples, component interconnect 115i can couple component terminal 115T of electronic component 115 to lead 11L (e.g., to internal plating 112). In some examples, component interconnect 115i can couple component terminal 115T of electronic component 115 to paddle 11P. In some examples, one end of conductive wire 115i can be ball-bonded to component terminal 115T by wire bonding machine, and the other end of conductive wire 115i can be stitch-bonded to lead 11L or paddle 11P by wire bonding machine, or vice-versa.

Figure 2G:
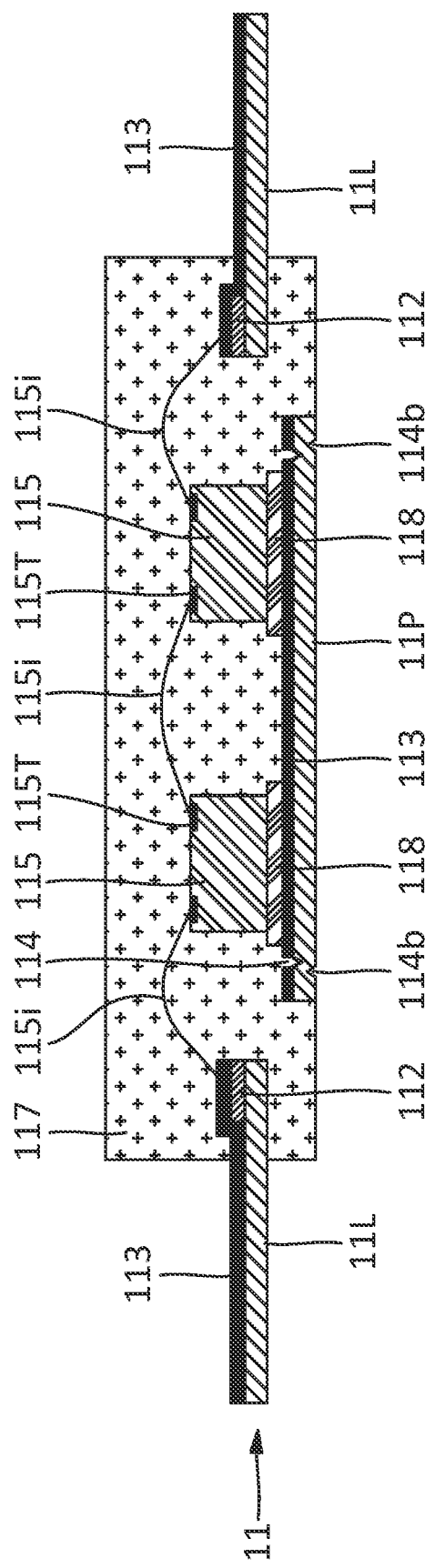

FIG. 2G shows a cross-sectional view of electronic device 10 at a later stage of manufacture. In the example shown in FIG. 2G, encapsulant 117 can be provided. In some examples, encapsulant 117 can contact, surround, or cover substrate 11, electronic component 115 or component interconnect 115i. In some examples, encapsulant 117 can comprise an encapsulant upper side, an encapsulant lower side opposite to the encapsulant upper side, and encapsulant lateral side between the encapsulant upper side and the encapsulant lower side. In some examples, the encapsulant lower side of the encapsulant 117 can be substantially coplanar with the paddle lower side of the paddle 11P. In some examples, the paddle lower side can be exposed from the encapsulant lower side. In some examples, encapsulant 117 can surround inner lead 11L1, and outer lead 11L2 of lead 11L can extend out of the encapsulant lateral side.

In some examples, encapsulant 117 can comprise or be referred to as an epoxy molding compound, an epoxy molding resin, or a sealant. In some examples, encapsulant 117 can comprise or be referred to as a molding part, a sealing part, an encapsulation part, a protection part, or a package body. In some examples, encapsulant 117 can comprise an organic resin, an inorganic filler, a curing agent, a catalyst, a coupling agent, a colorant, or a flame retardant. In some examples, encapsulant 117 can be provided in a variety of ways, such as compression molding, transfer molding, liquid encapsulant molding, vacuum lamination or paste printing. In some examples, the thickness of encapsulant 117 can range from approximately 500 µm to approximately 3000 µm. Encapsulant 117 can protect electronic component 115 and component interconnect 115i from external elements or environmental exposure.

Figure 2H:
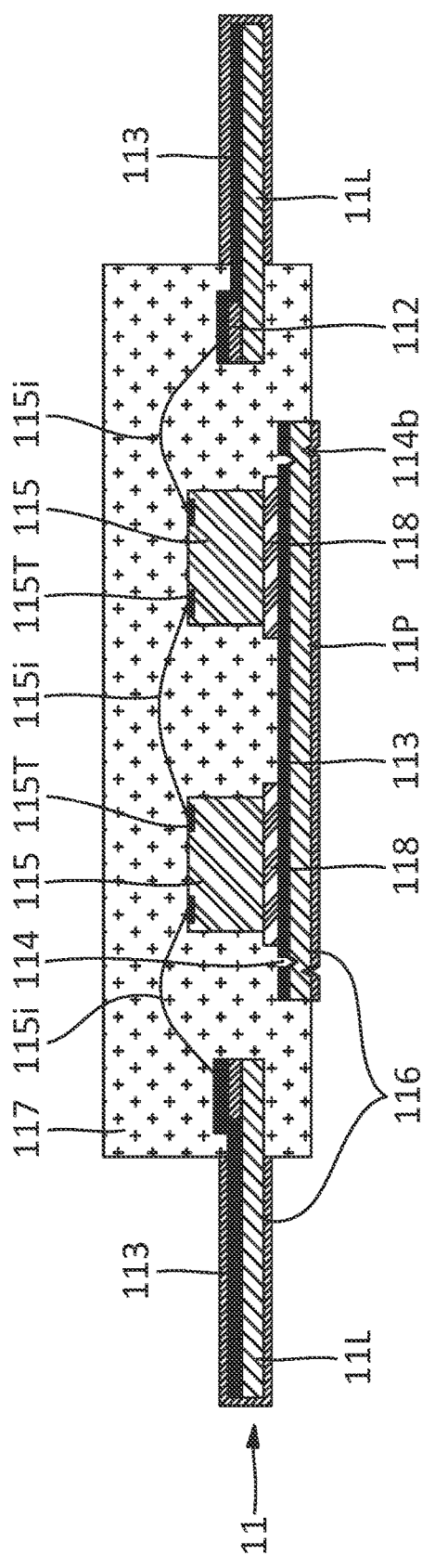

FIG. 2H shows a cross-sectional view of electronic device 10 at a later stage of manufacture. In the example shown in FIG. 2H, external plating 116 can be provided. In some examples, external plating 116 can be provided on outer lead 11L2 and paddle 11P. In some examples, external plating 116 can contact roughening 113, lead lower side, lead lateral side, and paddle lower side. In some examples, external plating 116 can comprise or be referred as solder plating. In some examples, the material of external plating 116 can comprise Sn or an alloy of Sn, Ag, Cu, or Bi. In some examples, the thickness of external plating 116 can range from approximately 1 μm to approximately 20 μm. In some examples, external plating 116 can improve solder wettability when outer lead 11L2 or paddle 11P is mounted on an external device.

Figure 2I:
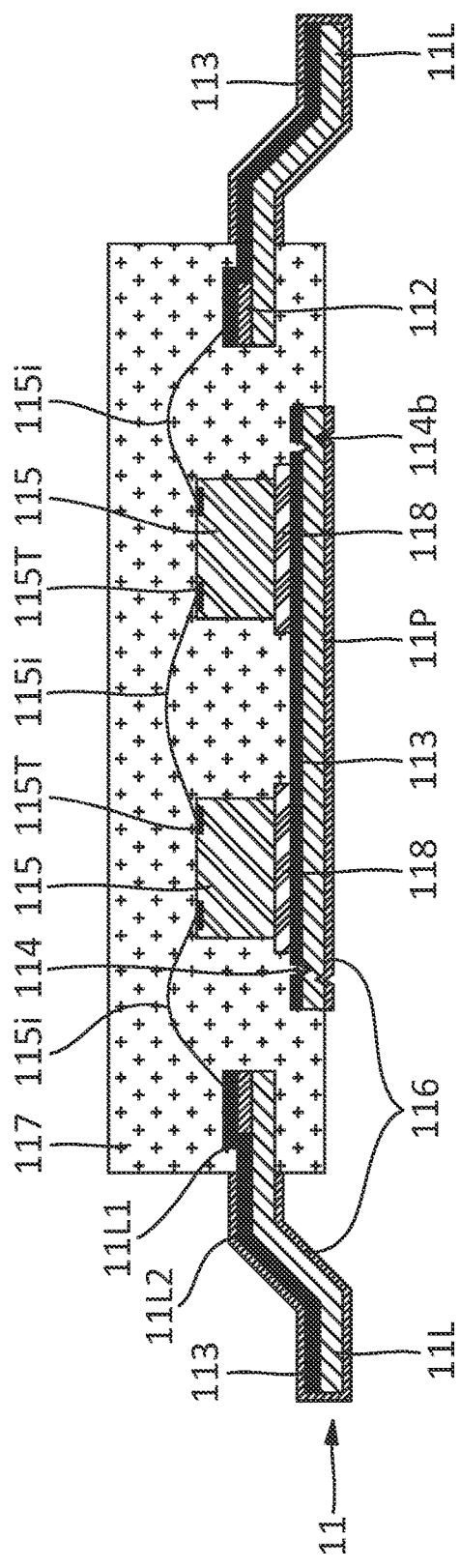

FIG. 2I shows a cross-sectional view of electronic device 10 at a later stage of manufacture. In the example shown in FIG. 2I, a bending process can be provided. In the bending process, the outer lead 11L2 can be bent by a bending machine. In some examples, after bending, the outer lead 11L2 can be positioned lower than paddle 11P. In some examples, after bending, the outer lead 11L2 can be substantially coplanar with paddle 11P. In some examples, the bending of outer lead 11L2 can occur at an earlier stage of manufacture.

In some examples, a singulation process, such as a dam bar cutting process and a suspension bar cutting process, can be performed through substrate 11 to define individual electronic devices 10.

FIGS. 3A and 3B show cross-sectional views of formation of example grooves 114 for example electronic devices, considering resin bleed. Such grooves 114 can correspond to grooves 114, 114a, or 114b described for FIGS. 1 and 2A to 2I.

Resin bleed can be a phenomenon that is commonly encountered when working with filled adhesive systems, such as silver epoxy paste or silver filled epoxy. Adhesive resin components as well as possibly some cross-linking agents can be observed to separate from the bulk adhesive when it is applied to substrate surfaces during a bonding operation. The separated resin can appear as a clear liquid flowing out from the edges of the adhesive fillet and wets adjacent surfaces. If the resin bleed covers areas of the paddle, the adhesion between such areas of paddle 11P and encapsulant 117 is reduced.

In the example shown in FIG. 3A, groove 114 is formed first, and then roughening 113 is applied. Roughening 113 is provided on the outside and inside of groove 114. The grains remaining within groove 114 can interact with or guide resin bleed from attachment film 118 to cross through and over groove 114 and extend to cover outward areas beyond groove 114 on the upper side of paddle 11P. Accordingly, the adhesion between groove 114 and encapsulant 117 can be unnecessarily reduced in such outward areas of paddle 11P covered by the resin bleed of attachment film 118, and this could lead to delamination.

In contrast, as seen in FIG. 3B, roughening 113 is applied first and then groove 114 is formed, such as by pressing or stamping. Roughening 113 remains outside groove 114, but the grains of roughening 113 inside groove 114 are crushed or smoothed into smoothed roughening 113a during the formation of groove 114 to provide smoothed sidewalls of groove 114. The smoothed sidewalls of groove 114, or the smoothed grains of smoothed roughening 113a, tend to not interact or guide resin bleed of attachment film 118. Such feature can restrict the resin bleed of attachment film 118 from going through and over groove 114 and from covering outward areas of paddle 11P, to protect the adhesiveness of such outward areas of paddle 11P with encapsulant 117.

FIGS. 4A, 4B, 4C, 4D, 4E, and 4F show top plan views of an example method for manufacturing an example substrate 11.

Figure 4B:
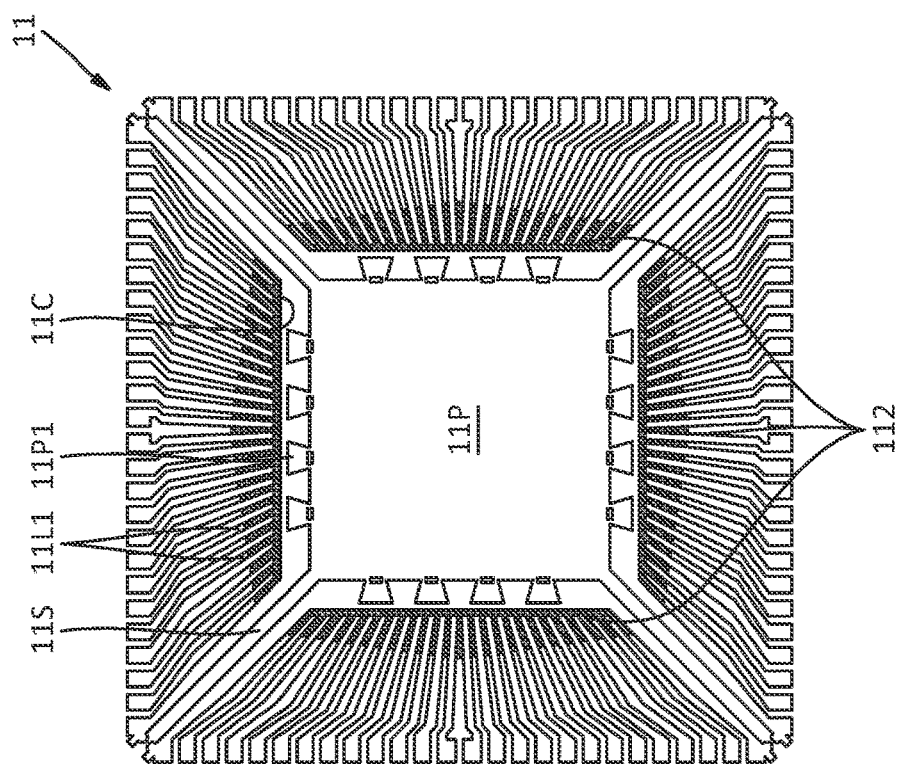
FIGS. 4A, 4B, 4C, 4D, 4E, and 4F show top plan views of an example method for manufacturing an example lead frame.
Figure 4A:
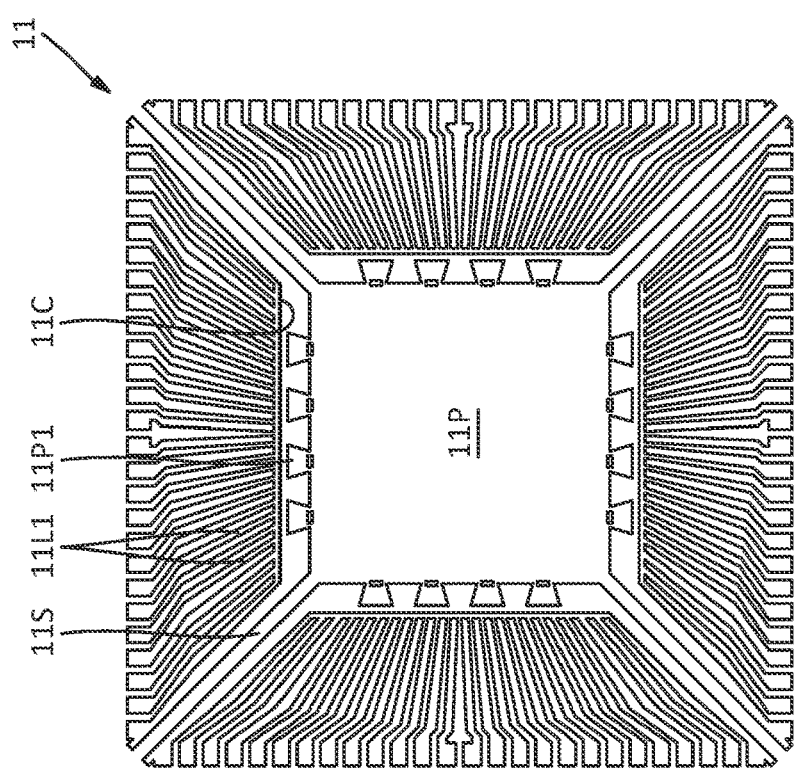

FIG. 4A shows a top plan view of an example substrate 11 at an early stage of manufacture. In the example shown in FIG. 4A, substrate 11 can comprise paddle 11P, paddle suspension leads 11S for supporting paddle 11P, leads 11L1 (inner leads) provided around paddle 11P so as to be separated from paddle 11P, and lead tip connectors 11C connecting leads (inner leads) 11L1 together. In some examples, paddle 11P can comprise a protrusions 11P1 (e.g., fins) extending outward from the perimeter to improve coupling with encapsulant 117. In some examples, a through hole can be provided at the boundary between the paddle 11P and protrusion 11P1 to improve coupling force with the encapsulant.

In some examples, substrate 11 can be manufactured by removing material from a metal plate of copper, copper-alloy, or iron-nickel alloy. In some examples, such removal can be done by etching (suitable for high density of leads) or stamping (suitable for low density of leads). In some examples, mechanical bending of leads can be applied after both techniques.

FIG. 4B shows a top plan view of an example substrate 11 at a later stage of manufacture. In the example shown in FIG. 4B, internal plating 112 can be provided on leads 11L and lead tip connectors 11C. In some examples, internal plating 112 can be provided on each upper side of leads 11L and lead tip connectors 11C.

Figure 4D:
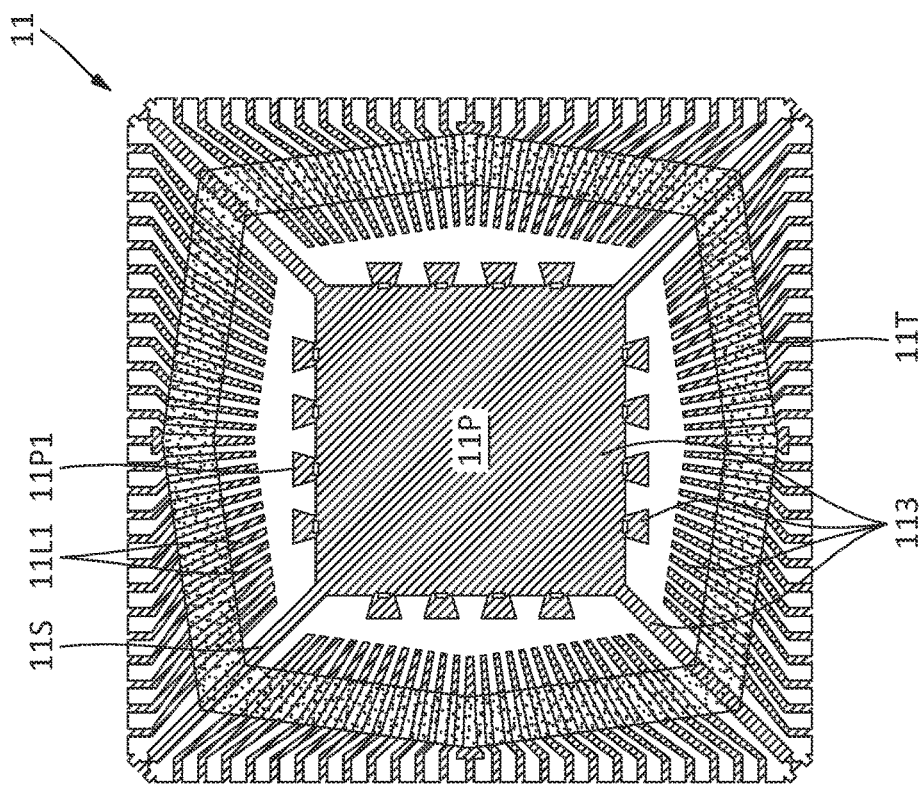
Figure 4C:
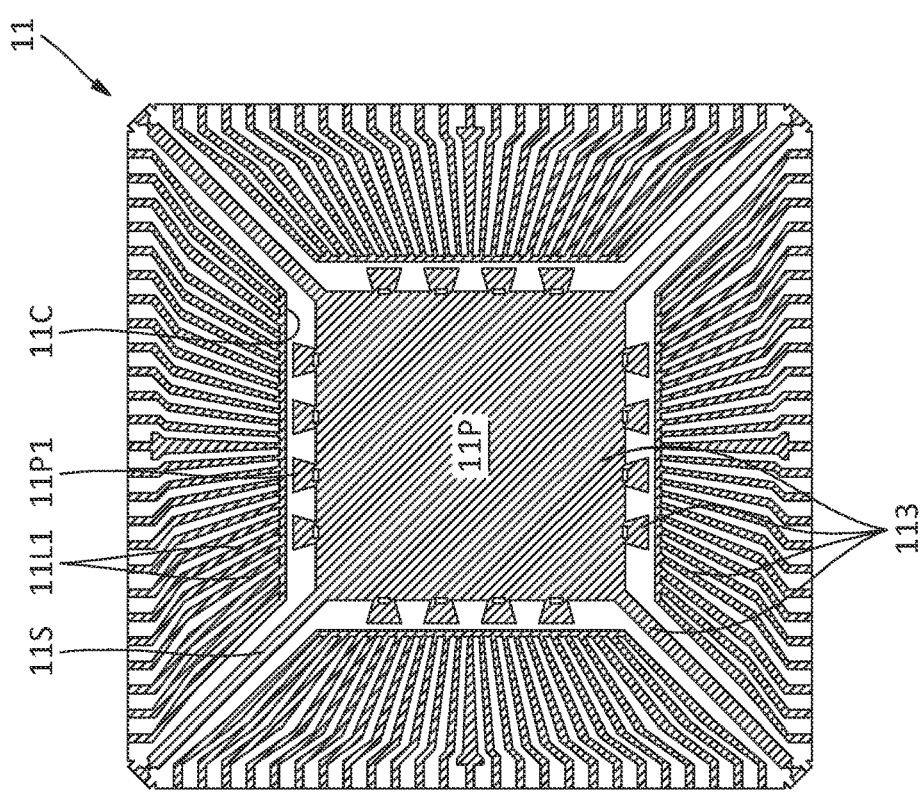

FIG. 4C shows a top plan view of an example substrate 11 at a later stage of manufacture. In the example shown in FIG. 4C, roughening 113 can be provided on paddle 11P, paddle suspension leads 11S, leads 11L and lead tip connectors 11C (indicated by shading in FIG. 4C). In some examples, roughening 113 can be provided on each upper side of paddle 11P, paddle suspension leads 11S, leads 11L and lead tip connectors 11C. Roughening 113 can cover internal plating 112. As described above, roughening 113 can provide grains such as fine needle-like or acicular crystals to improve adhesion with encapsulant 117. In some examples, anti-EBO can be coated over some or all portion of substrate 11. In some examples, anti-EBO can cover roughening 113 on leads 11L or roughening 113 on paddle 11P.

FIG. 4D shows a top plan view of an example substrate 11 at a later stage of manufacture. In the example shown in FIG. 4D, tape 11T (or film) can be provided on leads 11L and suspension leads 11S to prevent deformation of leads 11L. In some examples, tape 11T can be approximately in the shape of a square ring.

Figure 4F:
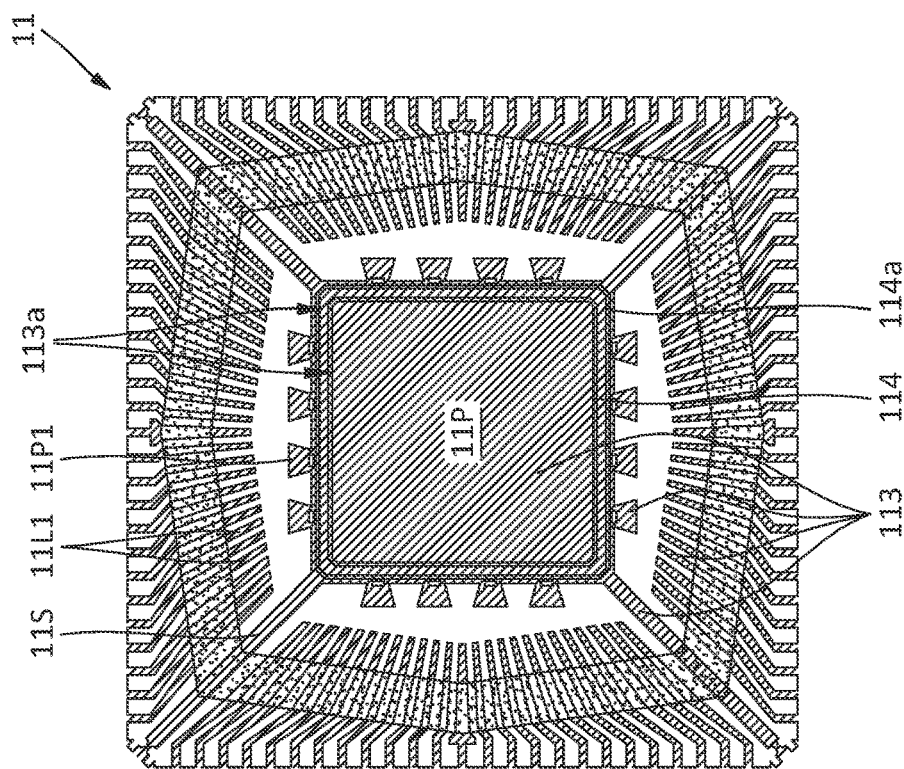
Figure 4E:
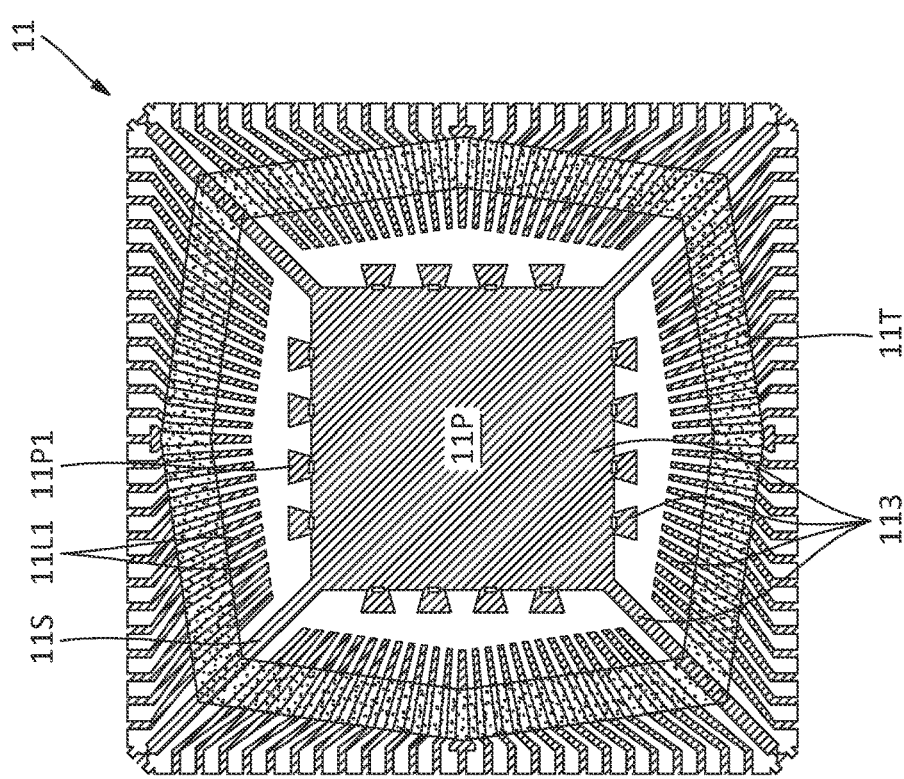

FIG. 4E shows a top plan view of an example substrate 11 at a later stage of manufacture. In the example shown in FIG. 4E, by cutting lead tip connectors 11C through the cutting device, leads 11L can be separated from each other.

FIG. 4F shows a top plan view of an example substrate 11 at a later stage of manufacture. In the example shown in FIG. 4F, groove 114 or 114a can be provided on the upper side of paddle 11P, such as by pressing or stamping. In some examples, grooves 114 or 114a can be provided in one or more rows spaced apart from the perimeter of paddle 11P. In some examples, groove 114 or 114a can be provided in the form of a generally square ring. As described above, since roughening 113 was already provided on paddle 11P, roughening 113 in groove 114 or 114a can be crushed or smoothed during formation of grooves 114 or 114a. As described above, this can define smoothed roughening 113a or smoothed sidewalls for groove 114 or 114a and can restrict bleed-out of from attachment film 118.

After the grooving process, a bending process of the protrusions or the suspension leads, a die attach process, a molding process, a dam bar cutting process, an outer lead bending process, and singulation (sawing) process can be performed. In some examples, the height of paddle 11P and the height of lead 11L can be different by the bending process.

FIG. 5 shows an X-ray top plan view of an example electronic device 10. In the example shown in FIG. 5, at least one electronic component 115 can be attached on paddle 11P through the attachment film, and electronic components 115 and leads 11L can be coupled to each other by component interconnects 115i.

Smoothed roughening 113a can be provided between the lateral side of paddle 11P and electronic component 115, so the low molecular weight compound (e.g., epoxy resin bleed) flowing out from the attachment film is restricted from bleeding out to outward areas of paddle 11P due to smoothed roughening 113a or the smoothed sidewalls of grooves 114, 114a.

Figure 6:
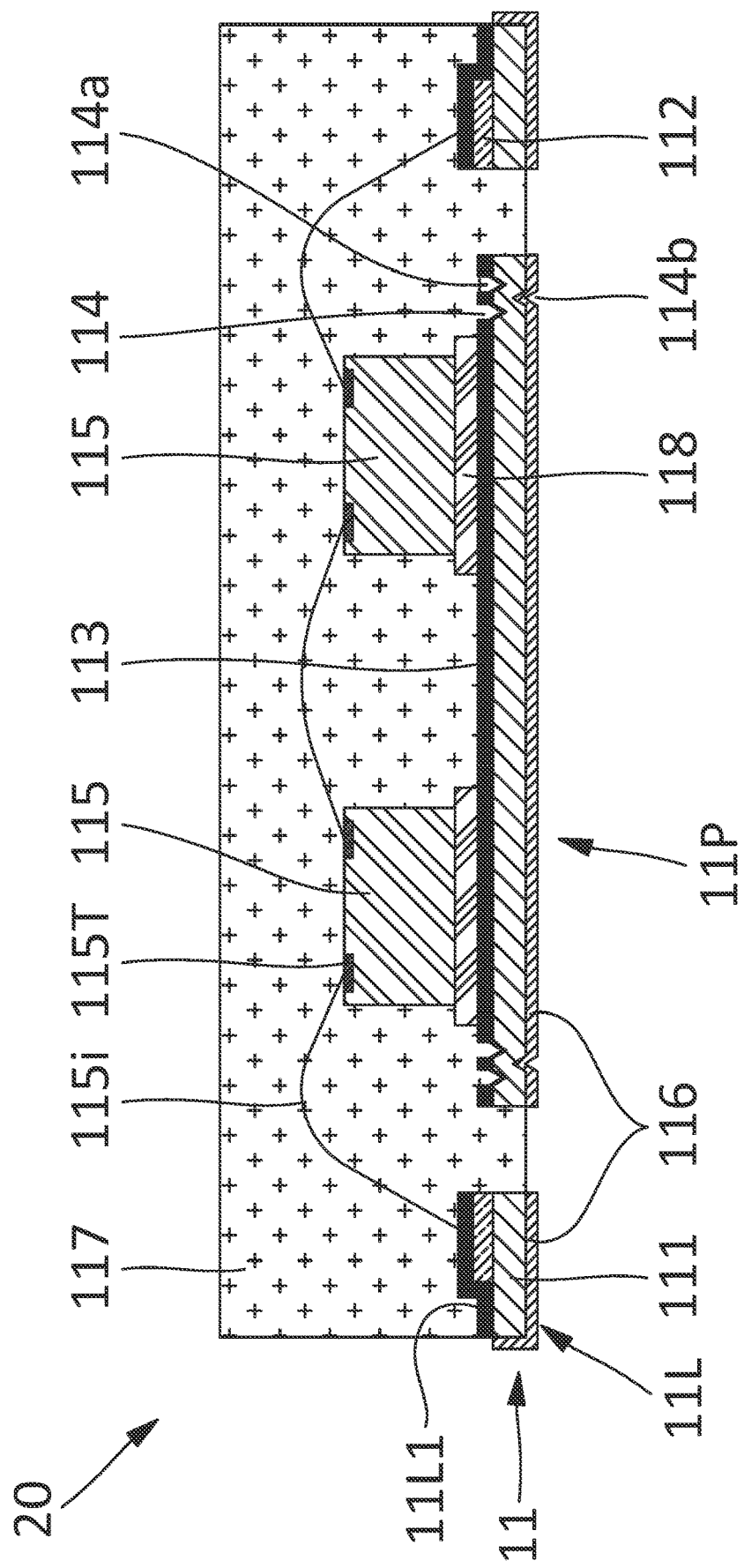
FIG. 6 shows a cross-sectional view of an example electronic device.

FIG. 6 shows a cross-sectional view of an example electronic device 20. In the example shown in FIG. 6, electronic device 20 can be similar to electronic device 10 illustrated in FIG. 1 and can lack outer lead 11L2. In some examples, the lower side of inner lead 11L1 can be coplanar with the lower side of paddle 11P or encapsulant 117. In some examples, the lateral side of inner lead 11L1 can be coplanar with the lateral side of encapsulant 117. In some examples, external plating 116 can be provided on the lateral side and lower side of inner lead 11L1 and lower side of paddle 11P. In some examples, since the lower side of inner lead 11L1 can be mounted to an external device instead of the outer lead, the footprint area of electronic device 20 can be reduced.

The present disclosure includes reference to certain examples; however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

What is claimed is:

1. A semiconductor device, comprising:
a conductive structure comprising:
  a paddle comprising an upper paddle side, a lower paddle side opposite to the upper paddle side, and a lateral paddle side between the upper paddle side and the lower paddle side; and
  a lead comprising an inner lead, an outer lead, an upper lead side, a lower lead side opposite to the upper lead side, and a lateral lead side between the upper lead side and the lower lead side;
an internal plating confined to the upper lead side of the inner lead;
a roughening on the upper paddle side, the upper lead side of the inner lead, the upper lead side of the outer lead, and the internal plating;
a groove in the upper paddle side extending partially into the paddle from the upper paddle side;
an electronic component attached to the upper paddle side with an attachment film, the electronic component proximate to the groove, laterally separated from the groove, and having a component terminal coupled to the internal plating;
an encapsulant covering the electronic component, at least portions of the roughening, the inner lead, the internal plating, and at least portions of the upper paddle side;
wherein:
  the groove has smoothed sidewalls comprising substantially planarized portions of the roughening;
  the encapsulant is within the groove; and
  the outer lead is external to the encapsulant; and
an external plating over the roughening on the upper lead side of the outer lead, over the lower lead side of the outer lead, and over the lower paddle side.

2. The semiconductor device of claim 1, wherein:
the groove is substantially devoid of the attachment film.

3. The semiconductor device of claim 1, wherein:
the roughening comprises grains of material formed on the upper paddle side, the upper lead side of the inner lead, the upper lead side of the outer lead, and the internal plating.

4. The semiconductor device of claim 1, wherein:
the roughening comprises acicular crystals.

5. The semiconductor device of claim 1, wherein:
the groove is interposed between the electronic component and the lateral paddle side; and
the roughening is on the upper paddle side at a location between the groove and the lateral paddle side.

6. The semiconductor device of claim 1, wherein:
the roughening is on at least a portion of the upper lead side.

7. The semiconductor device of claim 1, wherein:
the internal plating comprises silver; and
the internal plating comprises a thickness in range from 1 micron to 10 microns.

8. The semiconductor device of claim 1, wherein:
the roughening has a thickness from approximately 0.05 microns to approximately 0.2 microns; and
the roughening enhances adhesion between the encapsulant and the conductive structure.

9. A semiconductor device, comprising:
a substrate comprising:
  a paddle comprising an upper paddle side, a lower paddle side opposite to the upper paddle side, and a lateral paddle side between the upper paddle side and the lower paddle side; and
  a lead comprising an inner lead, an outer lead, an upper lead side, a lower lead side opposite to the upper lead side, and a lateral lead side between the upper lead side and the lower lead side;
an internal plating comprising a patterned structure on the upper lead side of the inner lead;
a roughened structure on the upper paddle side, the upper lead side of the inner lead, the upper lead side of the outer lead, and on the internal plating;
a first groove extending partially into the paddle;
an electronic component coupled to the paddle with an attachment film;
a conductive interconnect coupling the electronic component to the internal plating;
a package body covering the electronic component and at least portions of the paddle, the roughened structure, the internal plating, and the inner lead;
wherein:
  the first groove has smoothed sidewalls;
  the first groove is substantially devoid of the attachment film;
  the outer lead is external to the package body; and the roughened structure is configured to enhance adhesion between the package body and the substrate; and an external plating over the roughened structure on the upper lead side of the outer lead, over the lower lead side of the outer lead, and over the lower paddle side.

10. The semiconductor device of claim 9, wherein:
the internal plating comprises silver;
the internal plating comprises a thickness in range from 1 micron to 10 micron; and
the smoothed sidewalls of the first groove comprise smoothed portions of the roughened structure.

11. The semiconductor device of claim 9, wherein:
the internal plating in not external to the package body.

12. The semiconductor device of claim 9, wherein:
the first groove is a stamped groove.

13. The semiconductor device of claim 9, further comprising:
a second groove in the paddle.

14. A method of manufacturing a semiconductor device, comprising:
providing a conductive structure comprising:
a paddle comprising an upper paddle side, a lower paddle side opposite to the upper paddle side, and a lateral paddle side between the upper paddle side and the lower paddle side;
a lead comprising an inner lead, an outer lead, an upper lead side, a lower lead side opposite to the upper lead side, and a lateral lead side between the upper lead side and the lower lead side;
an internal plating confined to the upper lead side of the inner lead;
a roughening on the upper paddle side, the upper lead side of the inner lead, the upper lead side of the outer lead, and the internal plating; and
a groove in the upper paddle side extending partially into the paddle, wherein the groove has smoothed sidewalls;
coupling an electronic component to the upper paddle side with an attachment film, the electronic component proximate to and laterally separated from the groove;
providing an encapsulant covering the electronic component, at least portions of the roughening, the inner lead, the smoothed sidewalls, and at least portions of the upper paddle side;
wherein:
providing the conductive structure comprises exposing the conductive structure to an aqueous solution comprising:
an inorganic acid;
an oxidizer;
an auxiliary agent comprising an azole; and
an etching inhibitor;
the outer lead is external to the encapsulant;
the groove is substantially devoid of the attachment film; and
the roughening enhances adhesion between the encapsulant and the conductive structure; and
providing an external plating over the roughening on the upper lead side of the outer lead, over the lower lead side of the outer lead, and over the lower paddle side.

15. The method of claim 14, wherein:
the inorganic acid comprises one or more of hydrochloric acid, sulfuric acid, nitric acid, phosphoric acid, chloric acid, sulfamic acid, boric acid, or boric-hydrofluoric acid;
the oxidizer comprises hydrogen peroxide, ferric chloride, cupric chloride or a peroxo compound;
the auxiliary agent comprises one or more of diazole, triazole or tetrazole; and
the etching inhibitor comprises one or more of phosphorous acid, hypophosphorous acid or pyrophosphoric acid.

16. The method of claim 14, wherein:
providing the conductive structure comprises stamping the roughening into the upper paddle side to provide the groove; and
coupling the electronic component comprises attaching the electronic component to a portion of the roughening with the attachment film.

17. The method of claim 14, wherein:
providing the conductive structure comprises:
mechanically pressing the roughening and the paddle to form the groove with the smoothed sidewalls.

18. The method of claim 14, wherein:
coupling the electronic component comprises:
placing the electronic component into contact with the attachment film; and
heating the attachment film.

19. The method of claim 14, wherein:
after providing the roughening, providing the groove in the upper paddle side.

* * * * *